US012593699B2

(12) United States Patent
Hsu et al.

(10) Patent No.: US 12,593,699 B2
(45) Date of Patent: Mar. 31, 2026

(54) PACKAGE STRUCTURE

(71) Applicant: Taiwan Semiconductor Manufacturing Company, Ltd., Hsinchu (TW)

(72) Inventors: Chung-Yi Hsu, Hsinchu (TW); Kai-Chiang Wu, Hsinchu City (TW); Yen-Ping Wang, Changhua County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 36 days.

(21) Appl. No.: 18/516,974

(22) Filed: Nov. 22, 2023

(65) Prior Publication Data

US 2024/0088070 A1 Mar. 14, 2024

Related U.S. Application Data

(63) Continuation of application No. 17/218,137, filed on Mar. 30, 2021, now Pat. No. 11,855,011.

(51) Int. Cl.
| | |
|---|---|
| *H01L 23/66* | (2006.01) |
| *H01L 21/56* | (2006.01) |
| *H01L 23/00* | (2006.01) |
| *H01L 23/31* | (2006.01) |
| *H01L 23/538* | (2006.01) |
| *H01L 25/065* | (2023.01) |
| *H01Q 1/22* | (2006.01) |
| *H01Q 9/04* | (2006.01) |

(52) U.S. Cl.
CPC .............. *H01L 23/66* (2013.01); *H01L 21/56* (2013.01); *H01L 23/31* (2013.01); *H01L 23/5384* (2013.01); *H01L 23/5386* (2013.01); *H01L 24/94* (2013.01); *H01L 25/0657* (2013.01); *H01Q 1/2283* (2013.01); *H01Q 9/0407* (2013.01)

(58) Field of Classification Search
CPC . H01L 25/0657; H01L 23/31; H01L 23/5384; H01L 23/5386
See application file for complete search history.

(56) References Cited

U.S. PATENT DOCUMENTS

| | | | |
|---|---|---|---|
| 9,000,584 | B2 | 4/2015 | Lin et al. |
| 9,048,222 | B2 | 6/2015 | Hung et al. |
| 9,048,233 | B2 | 6/2015 | Wu et al. |
| 9,064,879 | B2 | 6/2015 | Hung et al. |
| 9,111,949 | B2 | 8/2015 | Yu et al. |
| 9,263,511 | B2 | 2/2016 | Yu et al. |
| 9,281,254 | B2 | 3/2016 | Yu et al. |
| 9,368,460 | B2 | 6/2016 | Yu et al. |
| 9,372,206 | B2 | 6/2016 | Wu et al. |
| 9,496,189 | B2 | 11/2016 | Yu et al. |

*Primary Examiner* — Trang Q Tran
(74) *Attorney, Agent, or Firm* — JCIPRNET

(57) ABSTRACT

Provided is a package structure and a method of forming the same. The package structure includes a semiconductor package, a stacked patch antenna structure, and a plurality of conductive connectors. The semiconductor package includes a die. The stacked patch antenna structure is disposed on the semiconductor package, and separated from the semiconductor package by an air cavity. The plurality of conductive connectors is disposed in the air cavity between the semiconductor package and the stacked patch antenna structure to connect the semiconductor package and the stacked patch antenna structure.

20 Claims, 15 Drawing Sheets

PACKAGE STRUCTURE

CROSS-REFERENCE TO RELATED APPLICATION

This application is a continuation application of and claims the priority benefit of a prior application Ser. No. 17/218,137, filed on Mar. 30, 2021 and now allowed. The entirety of the above-mentioned patent application is hereby incorporated by reference herein and made a part of this specification.

BACKGROUND

Semiconductor devices and integrated circuits are used in a variety of electronic applications, such as personal computers, cell phones, digital cameras, and other electronic devices. As the demand for shrinking electronic devices has grown, a need for smaller and more creative packaging techniques of semiconductor devices has emerged. Thus, packages such as wafer-level packaging (WLP) have begun to be developed. For example, the dies of the wafer may be processed and packaged with other semiconductor devices (e.g., antenna) at the wafer-level. In addition, since the demand of modern communication for more bandwidth, high performance package designs with integrated antenna are desired.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
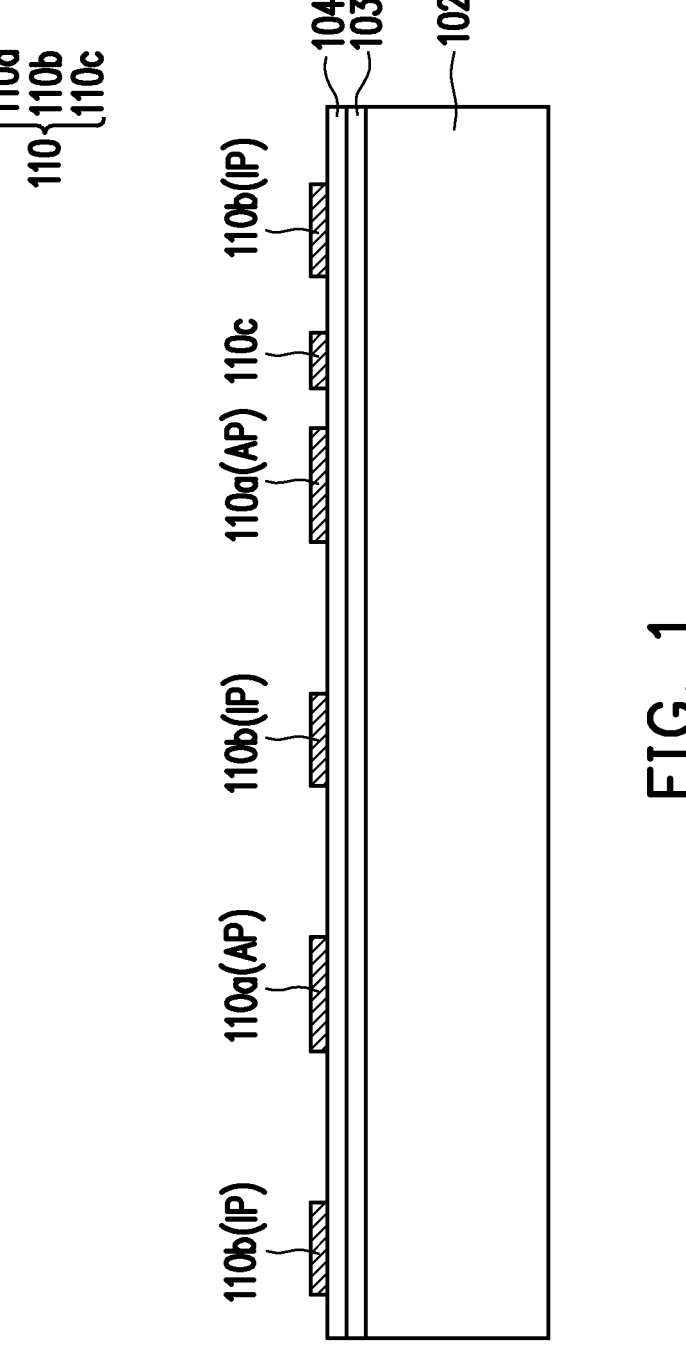
FIG. 1 to FIG. 10 are cross-sectional views of a method of forming a package structure in accordance with a first embodiment.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Embodiments discussed herein may be discussed in a specific context, namely a package structure having one or more integrated antennas and one or more semiconductor chips (e.g., a radio frequency (RF) chip, baseband chip, etc.). However, various embodiments may also be applied to other packages having embedded functional elements (e.g., waveguide lines) integrated with one or more semiconductor chips.

In accordance with some embodiments, a stacked patch antenna structure is bonded onto a semiconductor package and separated from the semiconductor package by an air cavity, so as to form a package-on-package (PoP) structure. In this case, the air cavity with low permittivity (Dk) and low loss tangent (Df) properties is able to increase the bandwidth and the gain of the package structure having one or more integrated antennas. In addition, one or more stacked patch antenna structures may be stacked on the semiconductor package, so as to enhance the bandwidth and the gain of the package structure. In such embodiment, the one or more stacked patch antenna structures may be coupled to the underlying semiconductor package through electro-magnetic field. Therefore, the power consumption between the RF die in the semiconductor package and the patch antenna in the stacked patch antenna structure can be reduced due to the reduction in the number of the conductive vias. Moreover, compared with the conventional package structure with more than two layers of the encapsulants, the package structure having one or more integrated antennas in only one layer of the encapsulant can effectively decrease the warpage issue and reduce the manufacturing cost.

FIG. 1 to FIG. 10 are cross-sectional views of a method of forming a package structure in accordance with a first embodiment. FIG. 11A is a schematic plane view of a first antenna device of a package structure in FIG. 10. FIG. 11B is a schematic plane view of a package structure in FIG. 10.

Referring to FIG. 1, a carrier 102 is provided. In some embodiments, the carrier 102 may be a glass carrier or any suitable carrier for the manufacturing method of the package structure. A de-bonding layer 103 is then formed on the carrier 102. In some embodiments, the de-bonding layer 103 functions as a temporary bonding layer suitable for bonding/debonding the carrier 102 from the above layers disposed thereon. In some embodiments, the de-bonding layer 103 is a light-to-heat conversion (LTHC) release layer formed on carrier 102. In some alternative embodiments, the de-bonding layer 103 may be a photo-curable release film whose viscosity is decreased by photo-curing process or a thermal curable release film whose viscosity is decreased by thermal-curing process.

Thereafter, a dielectric layer 104 is formed on the de-bonding layer 103, so that the de-bonding layer 103 is disposed between the carrier 102 and the dielectric layer 104. In some embodiments, the dielectric layer 104 includes an organic dielectric material, an inorganic dielectric material, or a combination thereof. The organic dielectric material may include a polymer material. The polymer material includes a photosensitive material, a non-photosensitive material, or a combination thereof. In some embodiments, the photosensitive material includes polyimide (PI), benzocyclobutene (BCB), polybenzooxazole (PBO), the like, or a combination thereof. The non-photosensitive material includes ABF. The inorganic dielectric material is, for example, silicon oxide, silicon nitride, silicon oxynitride, or a combination thereof. In addition, the dielectric layer 104 may be deposited by chemical vapor deposition (CVD), spin coating, or lamination. Although the dielectric layer 104 illustrated in FIG. 1 is a single-layered structure, the embodiments of the present invention are not limited thereto. In other embodiments, the dielectric layer 104 may include a bi-layered or multi-layered structure.

Afterward, a conductive layer 110 is formed on the dielectric layer 104. In some embodiments, the conductive layer 110 is formed by forming a conductive material (not shown) on the dielectric layer 104, and then patterning the conductive material by photolithographic and etching processes. In some embodiments, a material of the conductive layer 110 includes a metal material, such as aluminum, titanium, copper, nickel, tungsten, and/or alloys thereof.

In some embodiments, the conductive layer 110 at lease includes a first conductive pattern 110a and a second conductive pattern 110b. The first conductive pattern 110a may include a plurality of antenna patterns AP. In some embodiments, the antenna patterns AP are arranged as arrays such as the N×N array or N×M arrays (N, M>0, N may or may not be equal to M). The size of the array for the antenna patterns AP may be designated and selected based on the demand, and is not limited to the disclosure. In certain embodiments, the antenna patterns AP may include conductive blocks arranged in arrays, and in a top view, the shapes of the conductive blocks of the antenna patterns AP may be round, elliptical, oval, square, rectangular, tetragonal, hexagonal, octagonal, or any suitable polygonal shape. The second conductive pattern 110b may include a plurality of isolation patterns IP. In some embodiments, the antenna patterns AP and the isolation patterns IP are physically separated or isolated from one another, and the antenna patterns AP are surrounded by the isolation patterns IP. Further, the conductive layer 110 optionally includes a third conductive pattern 110c between the conductive pattern 110a and the second conductive pattern 110b. The third conductive pattern 110c may include one or more parasitic antennas patterns which is electrically floating, so as to increase the bandwidth of the package structure.

In some embodiments, the antenna patterns AP each have different functions, such as different transmitting frequencies. Owing to the isolation patterns IP, the antenna patterns AP having different transmitting frequencies can be grouped into sets respectively located in different regions defining by the perimeter of the isolation patterns IP, so that the interference between the antenna patterns AP can be suppressed, thereby reducing the surface noise among the antenna patterns AP. In this case, the performance of the package structure is further improved. Alternatively, one of the antenna patterns AP may be used as antenna receiver structures, and another of the antenna patterns AP may be used as an antenna transmitter structure.

However, it is appreciated that layouts and arrangements of the antenna patterns and isolation patterns may vary depending on the designs or electrical property requirements of the product, and the scope of this disclosure is not limited to the examples and descriptions disclosed above.

Figure 2:
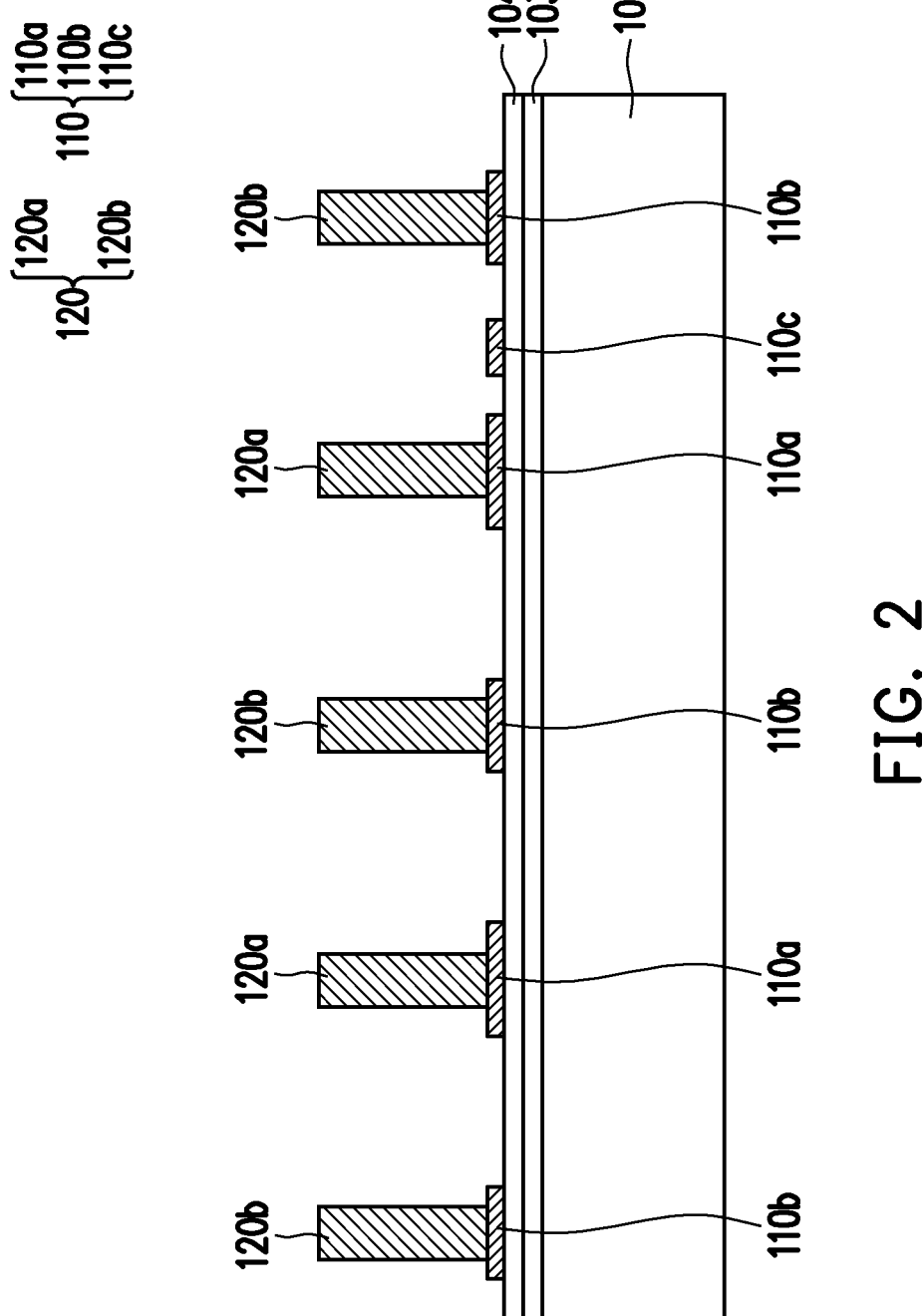

Referring to FIG. 2, a plurality of conductive vias 120 are formed on the conductive layer 110. In detail, the conductive vias 120 includes a plurality of first conductive vias 120a and a plurality of second conductive vias 120b. The first conductive vias 120a are formed on the first conductive pattern 110a and physically connected to the first conductive pattern 110a. In addition, the second conductive vias 120b are formed on the second conductive pattern 110b and physically connected to the second conductive pattern 110b. In some embodiments, no conductive via is formed on the third conductive pattern 110c, so that the third conductive pattern 110c is electrically floating or the third conductive pattern 110c is electrically isolated from the first conductive pattern 110a and the second conductive pattern 110b. In some embodiments, the formation of the conductive vias 120 includes forming a mask pattern (not shown) with openings, then forming a metallic material (not shown) filling up the openings by electroplating or deposition, and removing the mask pattern to form the conductive vias 120. A material of the conductive vias 120 may include copper, copper alloys, nickel, tungsten or other suitable metal materials. However, it is appreciated that the scope of this disclosure is not limited to the materials and descriptions disclosed above.

In some alternative embodiment, the conductive vias 120 may be pre-fabricated conductive posts bonded on the conductive layer 110 through an adhesive such as solder paste or the like. Specifically, the pre-fabricated conductive posts are provided and placed in apertures of a template. In some embodiments, the pre-fabricated conductive posts (e.g., copper posts or other suitable metal posts) are provided on the template and the pre-fabricated conductive posts are, for example, vibrated by a vibration machine, such that the pre-fabricated conductive posts can be partially inserted into the apertures of the template. The pre-fabricated conductive posts are then positioned and bonded onto the conductive layer 110 through the adhesive. In such embodiment, the fabrication costs and the fabrication cycle time of the pre-fabricated conductive posts are reduced, since the pre-fabricated conductive posts are not fabricated by sputtering, photolithography, plating, and photoresist stripping processes.

Figure 3:
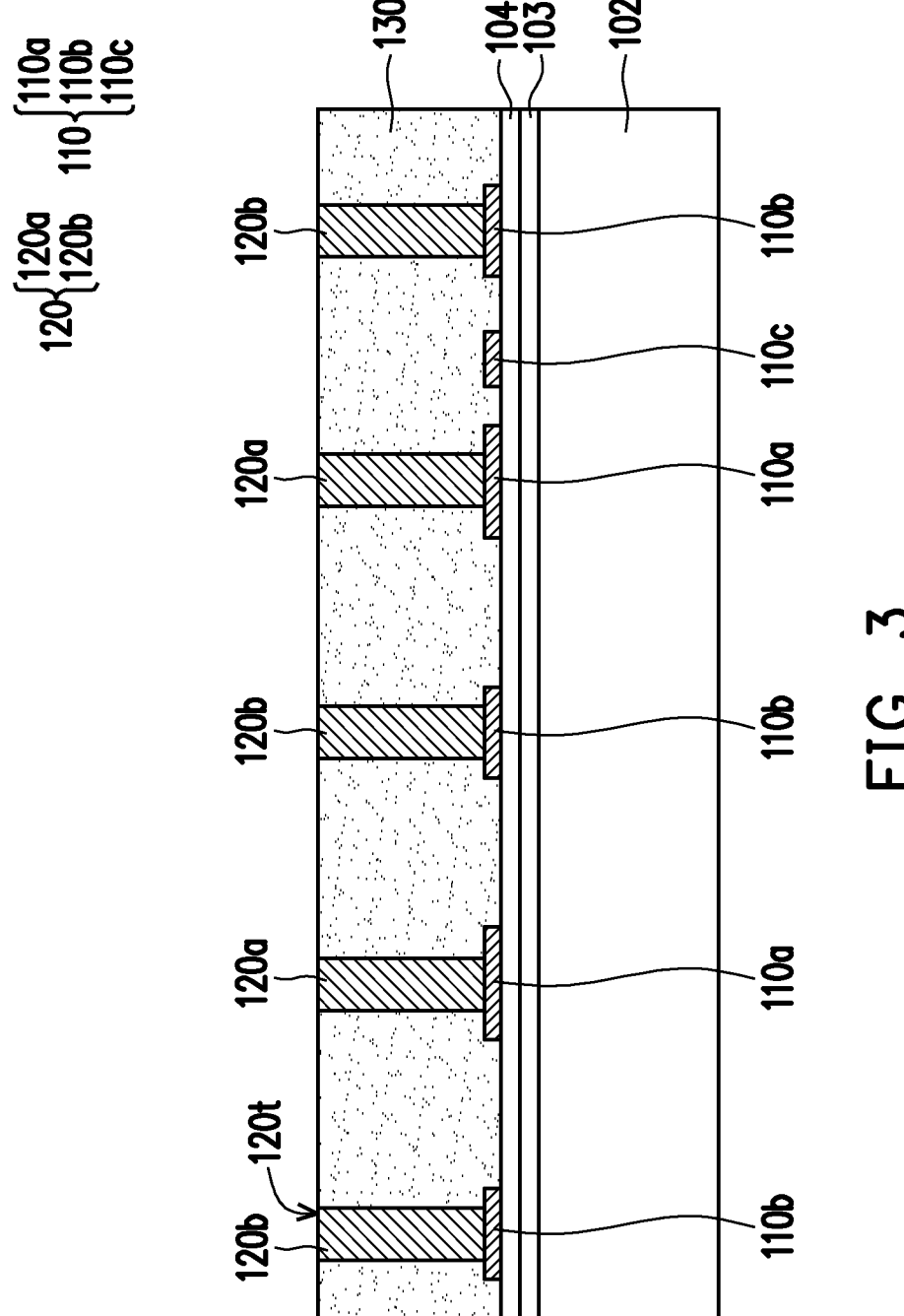

Referring to FIG. 3, an encapsulant 130 is formed to laterally encapsulate the conductive vias 120 and the conductive layer 110, and cover a top surface of the dielectric layer 104. In some embodiments, the encapsulant 130 laterally encapsulates the conductive vias 120 but top surfaces 120t of the conductive vias 120 are exposed. In such embodiment, the encapsulant 130 is formed by completely encapsulating the conductive vias 120 and then performing a planarization process to partially remove the encapsulant 130 to expose the top surfaces 120t of the conductive vias 120. That is, the top surface 130*t* of the encapsulant 130 is coplanar and/or level with the top surfaces 120*t* of the conductive vias 120. In some embodiments, the encapsulant 130 includes a molding compound, a molding underfill, a resin such as epoxy, a combination thereof, or the like. In some alternative embodiments, the encapsulant 130 includes a base material and a plurality of filler particles in the base material. In such embodiment, the base material may be a polymer, a resin, an epoxy, or the like; and the filler particles may be dielectric particles of $SiO_2$, $Al_2O_3$, silica, or the like, and may have spherical shapes. In some alternative embodiments, the filler particles may be solid or hollow. Also, the filler particles may have a plurality of different diameters.

Figure 4:
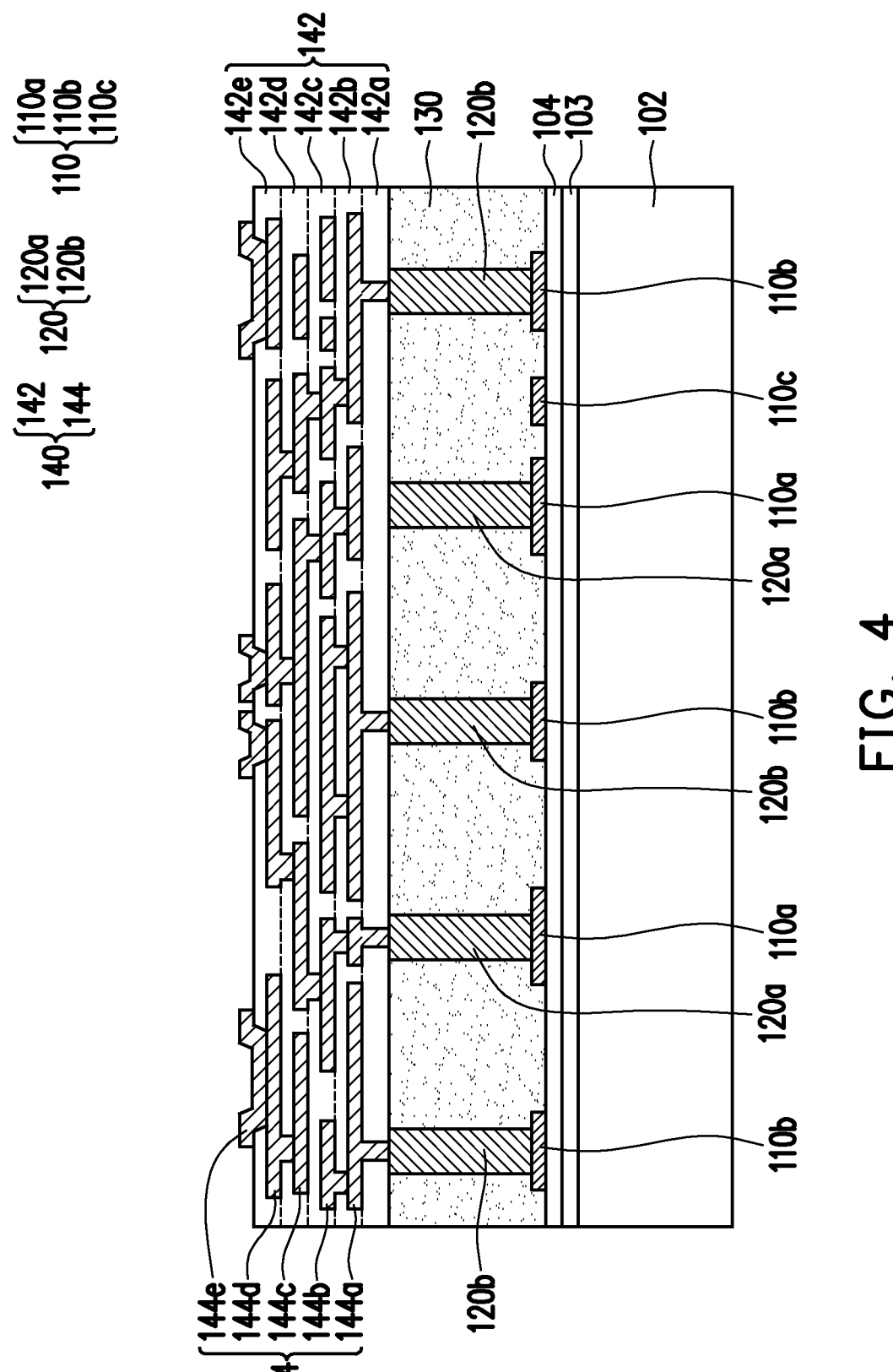

Referring to FIG. 4, a redistribution structure 140 is formed on the encapsulant 130 and on the conductive vias 120. Specifically, the redistribution structure 140 may include a plurality of polymer layers 142 (e.g., 142*a*, 142*b*, 142*c*, 142*d*, 142*e*) and a plurality of redistribution layers 144 (e.g., 144*a*, 144*b*, 144*c*, 144*d*, 144*e*) stacked alternately. The number of the polymer layers or the redistribution layers is not limited by the disclosure.

In some embodiments, the redistribution layer 144*a* penetrates through the polymer layer 142*a* to electrically connect to the conductive vias 120. The redistribution layer 144*b* penetrates through the polymer layer 142*b* and is electrically connected to the redistribution layer 144*a*. The redistribution layer 144*c* penetrates through the polymer layer 142*c* and is electrically connected to the redistribution layer 144*b*. The redistribution layer 144*d* penetrates through the polymer layer 142*d* and is electrically connected to the redistribution layer 144*c*. The redistribution layer 144*e* partially penetrates through the polymer layer 142*e* to contact the underlying redistribution layer 144*d*. In some embodiments, the topmost redistribution layer 144*e* may include a plurality of under-ball metallurgy (UBM) layers for ball mounting.

In some embodiments, the polymer layers 142 include a photo-sensitive material such as polybenzoxazole (PBO), polyimide (PI), benzocyclobutene (BCB), a combination thereof or the like. In some embodiments, the redistribution layers 144 include conductive materials. The conductive materials include metal such as copper, nickel, titanium, a combination thereof or the like, and are formed by an electroplating process. In some embodiments, the redistribution layers 144 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers 144 respectively includes a plurality of vias and a plurality of traces connected to each other. The vias penetrate through the polymer layers 142 and connect to the traces, and the traces are respectively located on the polymer layers 142, and are respectively extending on the top surfaces of the polymer layers 142.

Figure 5:
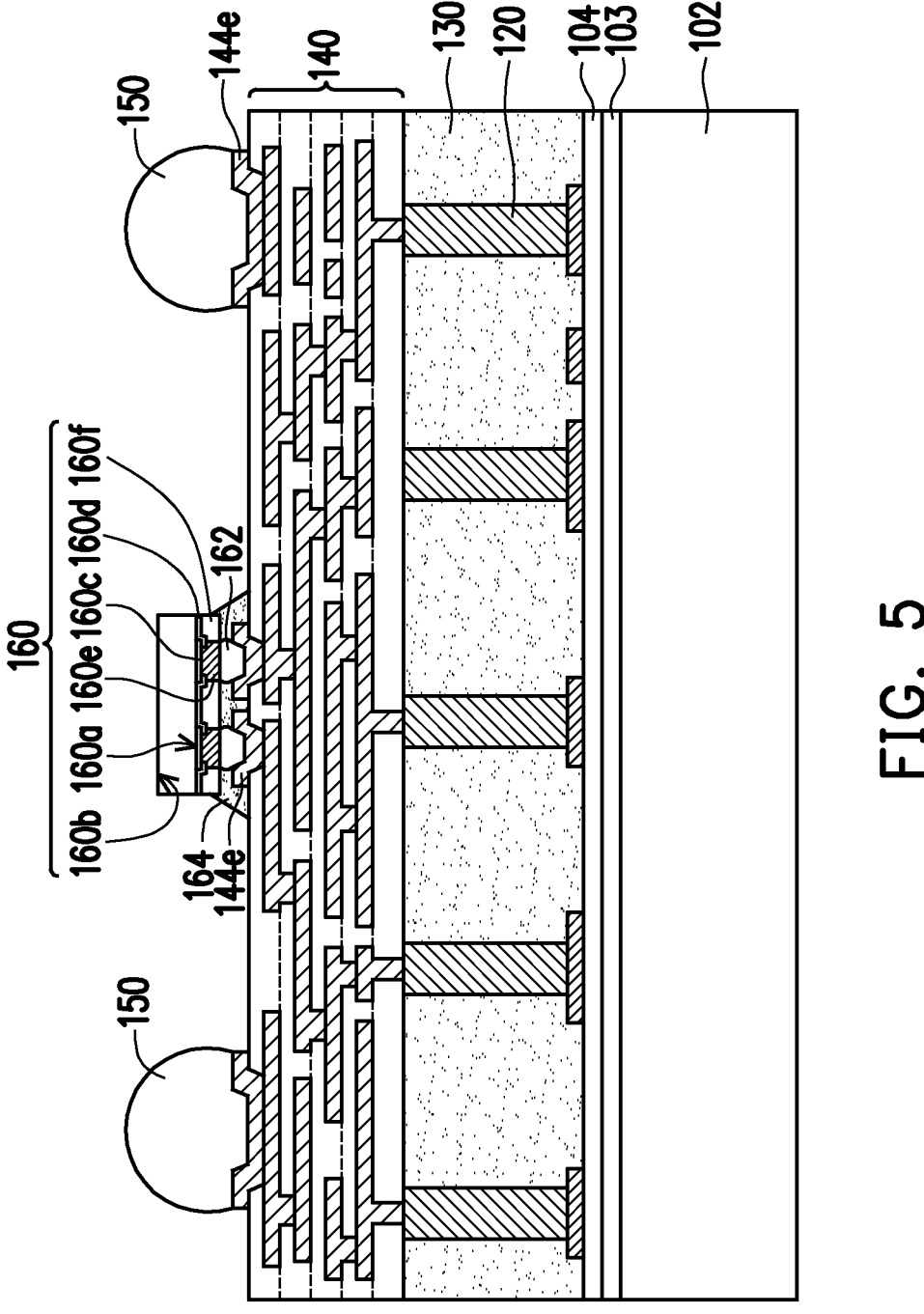

Referring to FIG. 5, a plurality of external connectors 150 are formed on the redistribution structure 140. In detail, the external connectors 150 are formed on the UBM layers 144*e* of the redistribution structure 140. In some embodiments, the external connectors 150 may be disposed on the UBM layers 144*e* by ball placement process or reflow process. In some embodiments, the external connectors 150 are, for example, solder balls or ball grid array (BGA) balls. In some embodiments, the external connectors 150 are electrically connected to other redistribution layers 144 (e.g., 144*a*, 144*b*, 144*c*, 144*d*) through the UBM layers 144*e*. The number of the external connectors 150 is not limited to the disclosure, and may be adjusted based on the needs.

In some embodiments, one or more semiconductor dies 160 are formed on the redistribution structure 140. In detail, the semiconductor die 160 is formed on the UBM layers 144*e* of the redistribution structure 140 between the external connectors 150. In some embodiments, only one semiconductor die 160 is presented for illustrative purposes, however it should be noted that one or more semiconductor dies may be provided.

Specifically, as shown in FIG. 5, the semiconductor die 160 may include an active surface 160*a* and a back surface 160*b* opposite to each other. The semiconductor die 160 further includes a plurality of pads 160*c*, a passivation layer 160*d*, a plurality of contacts 160*e*, and a protection layer 160*f*. The pads 160*c* are distributed on the active surface 160*a* of the semiconductor die 160. The passivation layer 160*d* covers the active surface 160*a* exposed by the pads 160*c* and a portion of the pads 160*c*. The contacts 160*e* are connected to the portion of the pads 160*c* exposed by the passivation layer 160*d* and a portion of the passivation layer 160*d*. The protection layer 160*f* is disposed on the passivation layer 160*d* and laterally encapsulates the contacts 160*e*.

In some embodiments, the pads 160*c* may be aluminum pads or other suitable metal pads. In some embodiments, the contacts 160*e* are copper pillars, copper alloy pillar or other suitable metal pillars, for example. In some embodiments, the passivation layer 160*d* and/or the protection layer 160*f* may be a polybenzoxazole (PBO) layer, a polyimide (PI) layer or other suitable polymers. In some alternative embodiments, the passivation layer 160*d* and/or the protection layer 160*f* may be made of inorganic materials, such as silicon oxide, silicon nitride, silicon oxynitride, or any suitable dielectric material. In certain embodiments, the materials of the passivation layer 160*d* and the protection layer 160*f* may be the same or different, the disclosure is not limited thereto.

In an alternative embodiment, the contacts 160*e* and the protection layer 160*f* may be omitted; that is, the semiconductor die 160 may include the pads 160*c* distributed on the active surface 160*a*, the passivation layer 160*d* covering the active surface 160*a* and the pads 160*c*, and the backside surface 160*f* opposite to the active surface 160*a*. The disclosure is not limited thereto.

As shown in FIG. 5, the semiconductor die 160 is bonded onto the redistribution structure 140 through reflow process or flip chip bonding process. That is, the active surface 160*a* of the semiconductor die 160 faces toward the redistribution structure 140, while the back surface 160*b* of the semiconductor die 160 faces upward. The semiconductor die 160 is bonded to the redistribution structure 140 by connecting a plurality of connectors 162 and the UBM layers 144*e*. In some embodiments, the connectors 162 are, for example, solder balls, solder paste or the like. In addition, an underfill layer 164 is then formed to laterally encapsulate the joints constituted by the UBM layers 144*e* and the connectors 162. With such configuration, the underfill layer 164 provides structural support and protection to the said joints. In some embodiments, the underfill layer 164 may be any acceptable material, such as a polymer, epoxy, molding underfill, or the like. The underfill layer 164 may be formed by a capillary flow process after the semiconductor die 160 is attached or may be formed by a suitable deposition method before the semiconductor die 160 attached.

In some embodiments, the semiconductor die 160 described herein may be referred to as a chip or an integrated circuit (IC). In some embodiments, the semiconductor die 160 includes at least one wireless and radio frequency (RF) chip. In some embodiments, the semiconductor die 160 may further include additional chip(s) of the same type or different types. For example, in an alternative embodiment, more than one semiconductor die 160 are provided, and the semiconductor dies 160, except for including at least one wireless and RF chip, may include the same or different types of chips selected from digital chips, analog chips or mixed signal chips, application-specific integrated circuit ("ASIC") chips, sensor chips, memory chips, logic chips or voltage regulator chips. In an alternative embodiment, the semiconductor die 160 may be referred to as a chip or an IC of combination-type, and the semiconductor die 160 may be a WiFi chip simultaneously including both of a RF chip and a digital chip. The disclosure is not limited thereto.

In some embodiments, the semiconductor dies 160 may be formed prior to the formation of the external connectors 150. In an alternative embodiment, the external connectors 150 may be formed after the formation of the semiconductor dies 160. The disclosure is not limited thereto.

Figure 6:
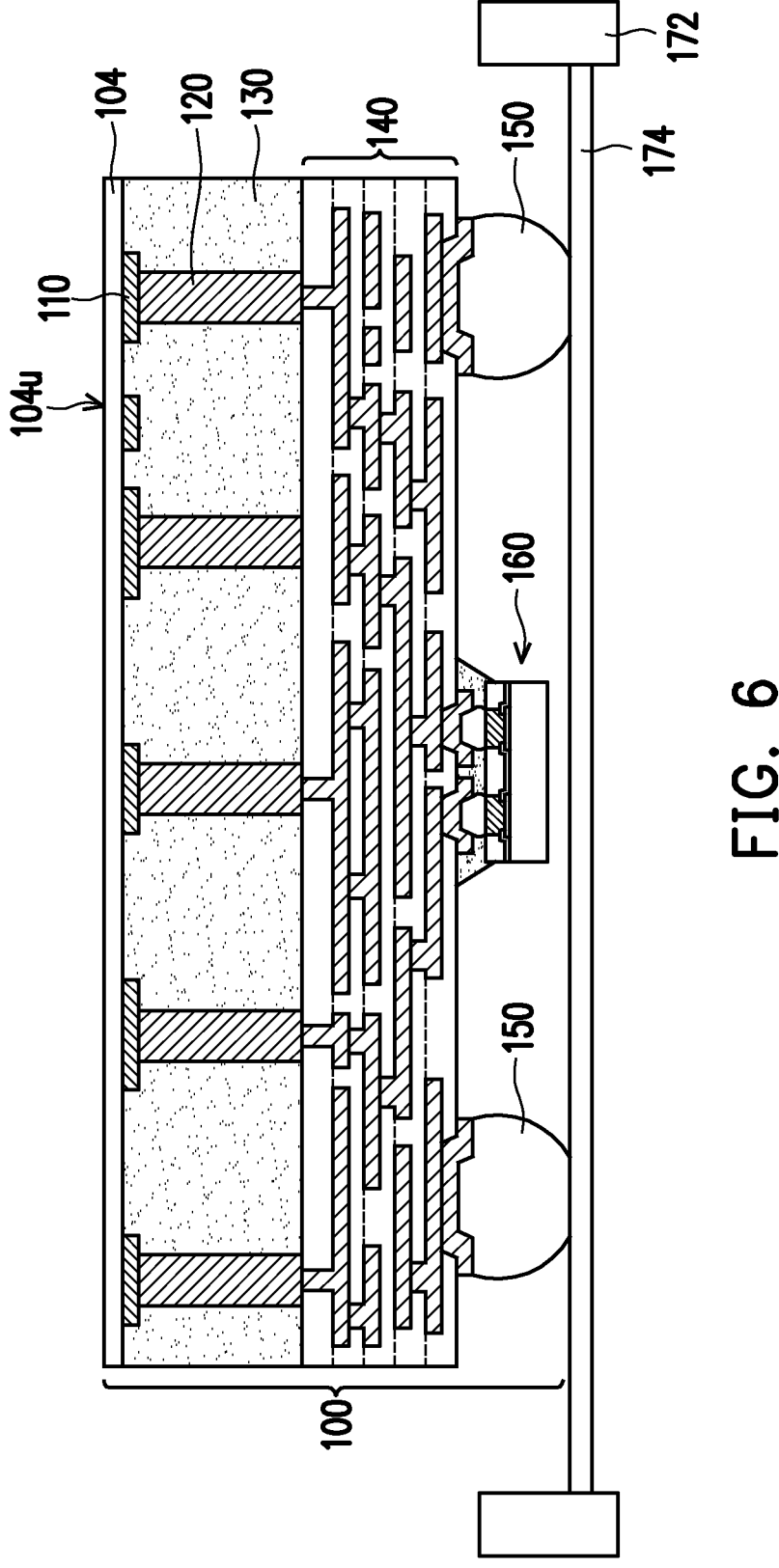

Referring to FIG. 6, the structure illustrated in FIG. 5 is flipped and mounted on a tape 174 held tightly by a frame 172. The tape 174 helps to provide support, so that the carrier 102 and the de-bonding layer 103 may be removed. In some embodiments, the de-bonding layer 103 may be formed of an adhesive such as an Ultra-Violet (UV) glue, a LTHC glue, or the like, or other types of adhesives. The de-bonding layer 103 is decomposable under the heat of light, thereby releasing the carrier 102 from the underlying structure. After debonding the carrier 102, the upper surface 104u of the dielectric layer 104 is exposed and a semiconductor package 100 is formed, as shown in FIG. 6.

Figure 7:
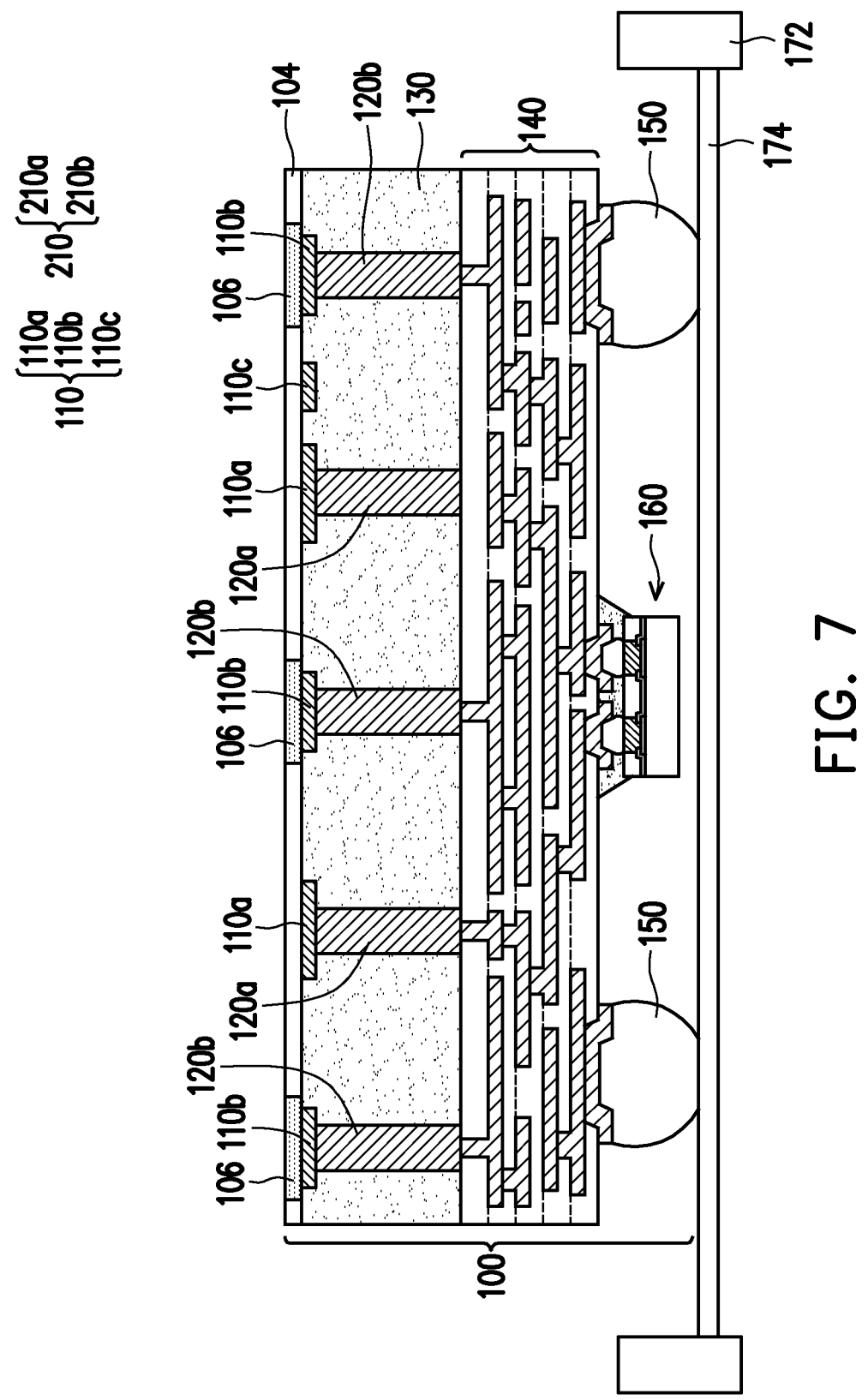

Referring to FIG. 7, after releasing the carrier 102, the exposed dielectric layer 104 is patterned to form a plurality of openings (not shown) by a lithography process, a laser drilling process, or other suitable processes. In some embodiments, the openings expose the second conductive pattern 110b, while the dielectric layer 104 covers the first conductive pattern 110a and the third conductive pattern 110c. A conductive material is then filled in the openings to form a plurality of bonding pads 106 contacting the second conductive pattern 110b. In some embodiments, the conductive material may include a metal material, such as aluminum, titanium, copper, nickel, tungsten, and/or alloys thereof. The conductive material may be formed by a suitable process, such as electro-chemical plating process, CVD, atomic layer deposition (ALD), PVD or the like.

Figure 8:
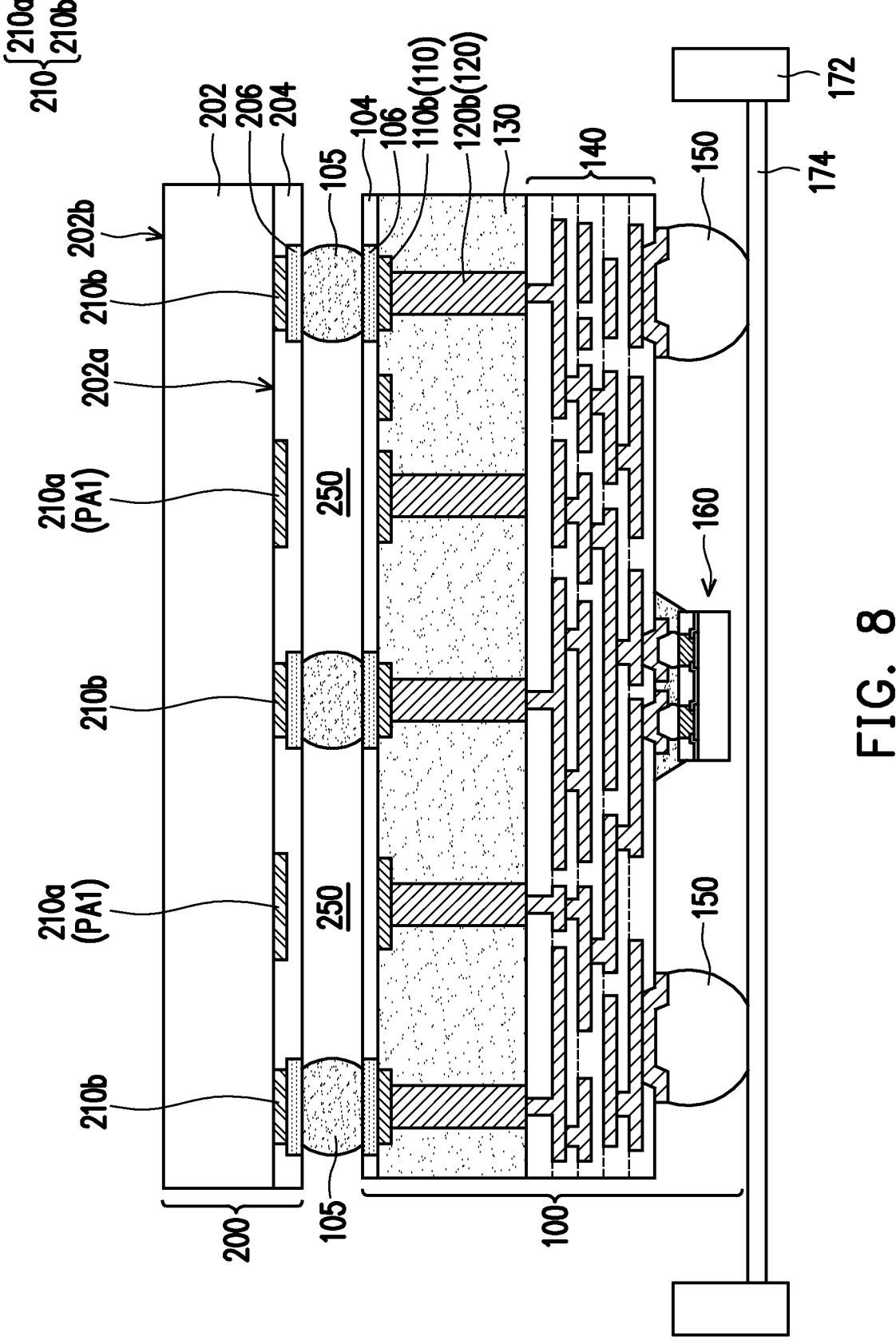

Referring to FIG. 8, a stacked patch antenna structure 200 is bonded onto the semiconductor package 100 by a plurality of conductive connectors 105. In detail, the stacked patch antenna structure 200 may include a substrate 202 and a conductive layer 210. The substrate 202 may have a first surface 202a and a second surface 202b opposite to each other. In some embodiments, the substrate 202 includes a dielectric material with low permittivity (Dk) and low loss tangent (Df) properties, thereby achieving a low loss in gain for the stacked patch antenna structure 200 in the antenna application. For example, a value of low Dk is in range of 2 to 4, and a value of low Df is less than 0.001. In some embodiments, the substrate 202 may be made of a dielectric material, glass, organic materials, or the like. In some alternative embodiments, the substrate 202 may be made of a molding compound.

In some embodiments, the conductive layer 210 is formed by forming a conductive material (not shown) on the first surface 202a of the substrate 202, and then patterning the conductive material by photolithographic and etching processes. In some embodiments, a material of the conductive layer 210 includes a metal material, such as aluminum, titanium, copper, nickel, tungsten, and/or alloys thereof. In some embodiments, the conductive layer 210 includes a first conductive pattern 210a and a second conductive pattern 210b. The first conductive pattern 210a may include a plurality of lower patch antennas PA1 corresponding to the antenna patterns AP of the first conductive pattern 110a. That is, the lower patch antennas PA1 may be arranged as arrays such as the N×N array or N×M arrays (N, M>0, N may or may not be equal to M), in some embodiments. The size of the array for the lower patch antennas PA1 may be designated and selected based on the demand, and is not limited to the disclosure. In certain embodiments, the lower patch antennas PA1 may include conductive blocks arranged in arrays, and in a top view, the shapes of the conductive blocks of the lower patch antennas PA1 may be round, elliptical, oval, square, rectangular, tetragonal, hexagonal, octagonal, or any suitable polygonal shape.

In addition, the second conductive pattern 210b may corresponds and is electrically connected to the second conductive pattern 110b by a plurality of joints constitute of the bonding pads 106, 206 and the conductive connectors 105 therebetween. In some embodiments, the conductive connectors 105 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 105 may include a conductive material such as solder, copper, aluminum, gold, nickel, silver, palladium, tin, the like, or a combination thereof. In some embodiments, the conductive connectors 105 are formed by initially forming a layer of solder through such commonly used methods such as evaporation, electroplating, printing, solder transfer, ball placement, or the like. Once a layer of solder has been formed on the structure, a reflow may be performed in order to shape the material into the desired bump shapes. In another embodiment, the conductive connectors 105 are metal pillars (such as a copper pillar) formed by a sputtering, printing, electro plating, electroless plating, CVD, or the like. The metal pillars may be solder free and have substantially vertical sidewalls. In some embodiments, a metal cap layer (not shown) is formed on the top of the metal pillar connectors 105. The metal cap layer may include nickel, tin, tin-lead, gold, silver, palladium, indium, nickel-palladium-gold, nickel-gold, the like, or a combination thereof and may be formed by a plating process.

Further, the stacked patch antenna structure 200 also includes a dielectric layer 204 covering the surface of the conductive layer 210 (at least including the lower patch antennas PA1) and laterally encapsulating the bonding pads 206, thereby protecting the lower patch antennas PA1 from being damaged. In some embodiments, the dielectric layer 204 includes an organic dielectric material, an inorganic dielectric material, or a combination thereof. The organic dielectric material may include a polymer material. The polymer material includes a photosensitive material, a non-photosensitive material, or a combination thereof. In some embodiments, the photosensitive material includes polyimide (PI), benzocyclobutene (BCB), polybenzooxazole (PBO), the like, or a combination thereof. The non-photosensitive material includes ABF. The inorganic dielectric material is, for example, silicon oxide, silicon nitride, silicon oxynitride, or a combination thereof. In addition, the dielectric layer 204 may be deposited by chemical vapor deposition (CVD), spin coating, or lamination. Although the dielectric layer 204 illustrated in FIG. 1 is a single-layered structure, the embodiments of the present invention are not limited thereto. In other embodiments, the dielectric layer 204 may include a bi-layered or multi-layered structure.

It should be noted that, in the present embodiment, the stacked patch antenna structure 200 is separated from the semiconductor package 100 by an air cavity 250. The air cavity 250 is filled with air with low permittivity (Dk=1) and low loss tangent (Df=0) properties, so as to decrease the signal loss between the semiconductor package 100 and the stacked patch antenna structure 200, thereby increasing the bandwidth and the gain of the package structure. In addition, the conductive connectors 105 in the air cavity 250 between the semiconductor package 100 and the stacked patch antenna structure 200 can provide structural support for the package structure.

Figure 9:
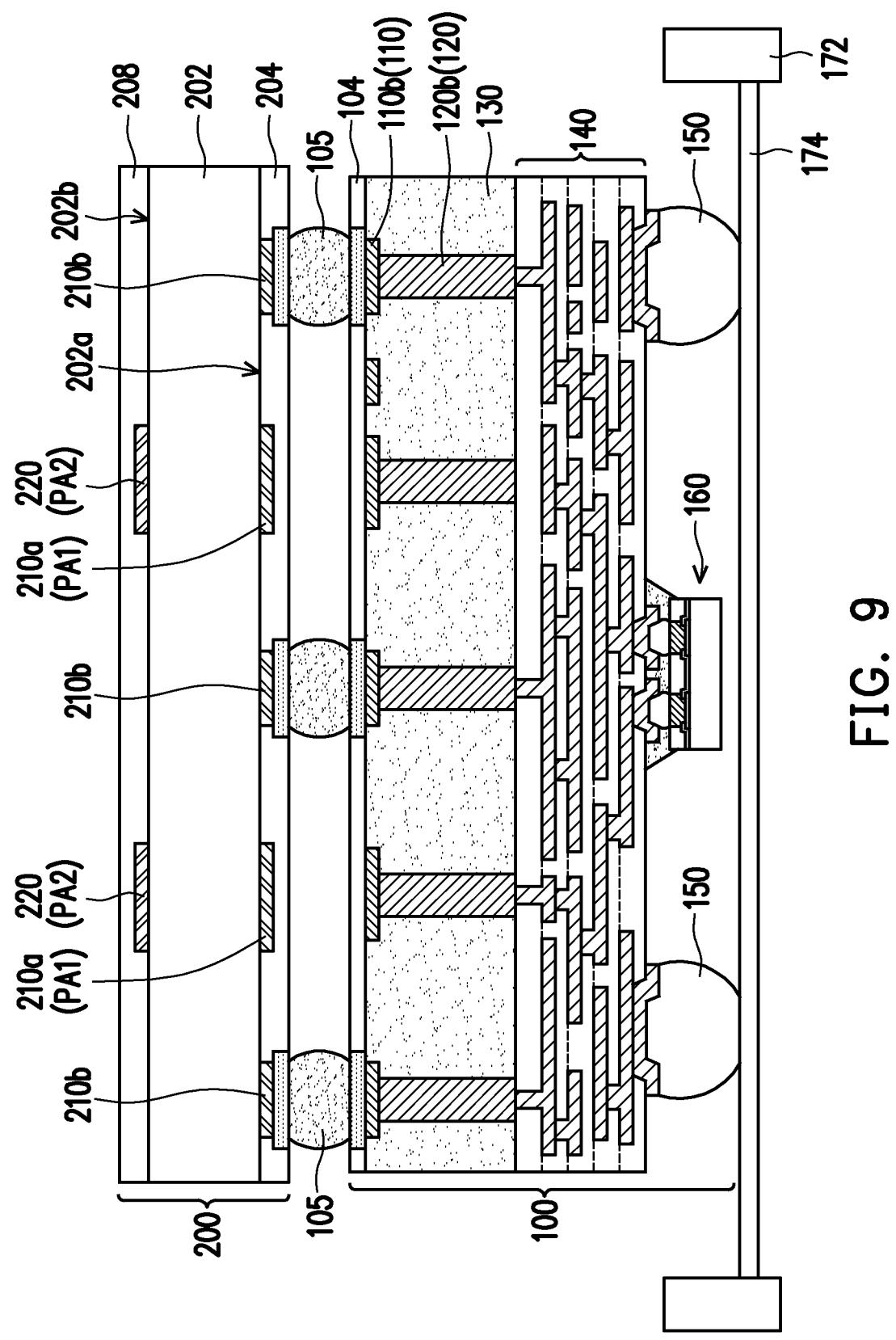

Referring to FIG. 9, a conductive layer 220 is optionally formed on the second surface 202b of the substrate 202. The conductive layer 220 may be formed by forming a conductive material (not shown) on the second surface 202b of the substrate 202, and then patterning the conductive material by photolithographic and etching processes. In some embodiments, a material of the conductive layer 220 includes a metal material, such as aluminum, titanium, copper, nickel, tungsten, and/or alloys thereof. In the present embodiment, the conductive layer 220 includes a solder paste and may be formed by any suitable process, such as a printing process. In some embodiments, the conductive layer 220 may include a plurality of upper patch antennas PA2 corresponding to the lower patch antennas PA1. That is, the upper patch antennas PA2 may be arranged as arrays such as the N×N array or N×M arrays (N, M>0, N may or may not be equal to M), in some embodiments. The size of the array for the upper patch antennas PA2 may be designated and selected based on the demand, and is not limited to the disclosure. In certain embodiments, the upper patch antennas PA2 may include conductive blocks arranged in arrays, and in a top view, the shapes of the conductive blocks of the upper patch antennas PA2 may be round, elliptical, oval, square, rectangular, tetragonal, hexagonal, octagonal, or any suitable polygonal shape.

Further, the stacked patch antenna structure 200 also includes a dielectric layer 208 covering the surface of the conductive layer 220, so as to prevent the conductive layer 220 (including the upper patch antennas PA2) from being damaged. In some embodiments, the dielectric layer 208 is similar to the dielectric layer 204, that is, the material, forming method and function of the dielectric layer 208 are similar to those of the dielectric layer 204, and thus the details are omitted herein.

Figure 10:
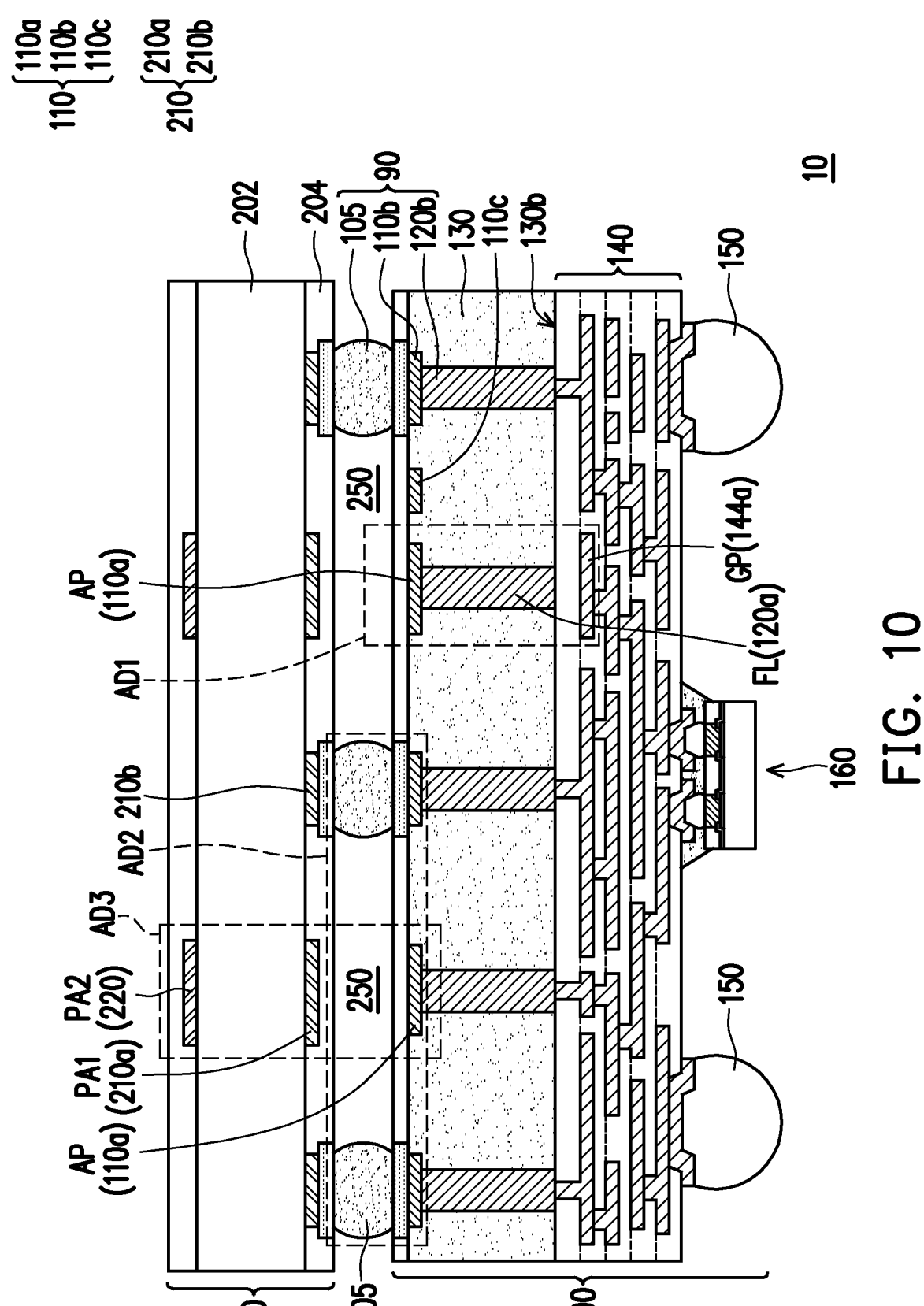
Figure 11B:
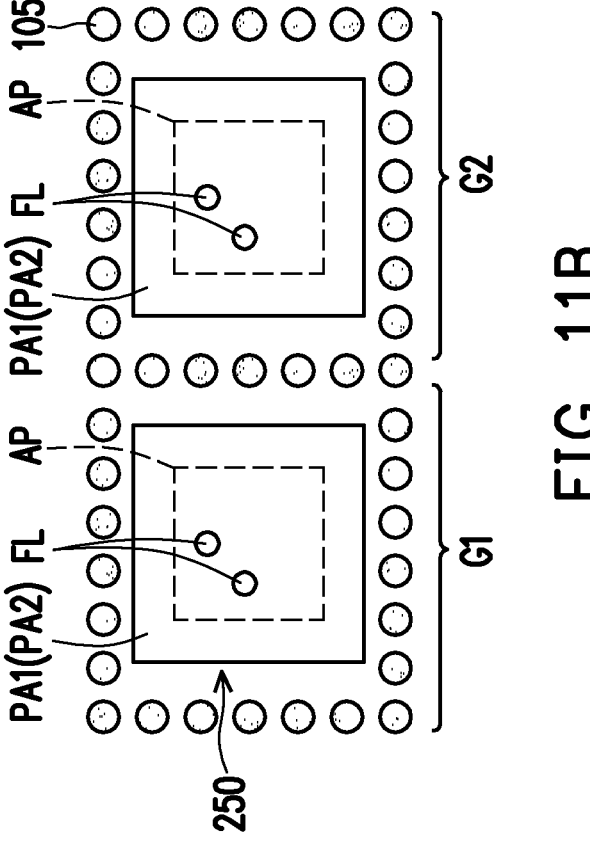
FIG. 11B is a schematic plane view of a package structure in FIG. 10.
Figure 11A:
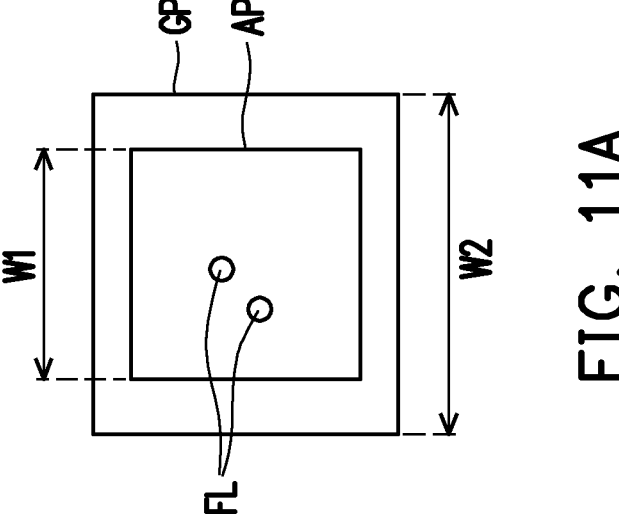
FIG. 11A is a schematic plane view of a first antenna device of a package structure in FIG. 10.

After removing the tape 174 and the frame 172, as shown in FIG. 10, a package structure 10 is accomplished. In some embodiments, the package structure 10 includes the semiconductor package 100 bonded to the stacked patch antenna structure 200 by the conductive connectors 105, so as to form a package-on-package (PoP) structure. The package structure 10 may have one or more integrated antenna devices to achieve wireless communication applications.

In some embodiments, the package structure 10 at least includes a first antenna device AD1, a second antenna device AD2, and a third antenna device AD3. Specifically, the first antenna device AD1 may include one of the antenna patterns AP, a corresponding ground plane GP, and a portion of the encapsulant 130 therebetween. In some embodiments, as shown in the plane view of FIG. 11A, the antenna pattern AP may be referred to as a patch antenna, which is located directly over the ground plane GP. In the example embodiment, the antenna pattern AP has a square shape with a first width W1, and the ground plane GP has a greater square shape with a second width W2. The first width W1 may be less than the second width W2. In some embodiments, a ratio (W2/W1) of the second width W2 to the first width W1 is in a range of 1.25 to 1.50. From another perspective, the antenna pattern AP may have a vertical projection that falls within a range of a vertical projection of the ground plane GP. In operation, the first antenna device AD1 transmits and/or receives a signal by oscillating the signal between the ground plane GP and the antenna pattern AP. The first width W1 of the antenna pattern AP may be adjusted to enable the first antenna device AD1 to have desired frequency-based characteristics, thereby achieving the wireless communication applications. Accordingly, the value of the first width W1 is not limited in the present embodiment. In addition, the first antenna device AD1 further includes feed lines FL. In some embodiments, the semiconductor die 160 receives and transmits signals to the antenna pattern AP through the feed lines FL during operation. In such embodiment, the first conductive vias 120a illustrated in FIG. 10 may be referred to as the feed lines FL. Although the connection between the feed lines FL and the redistribution structure 140 is not shown in the cross-sectional view of FIG. 10, the feed lines FL is electrically connected to the semiconductor die 160 through the redistribution structure 140 in another cross-sectional view. The feed lines FL are electrically or physically connected to the antenna pattern AP, while the feed lines FL are electrically or physically isolated from the ground plane GP.

On the other hand, as shown in FIG. 10 and FIG. 11B, the conductive connectors 105 may surround the antenna pattern AP to form a resonant cavity in the air cavity 250 between the semiconductor package 100 and the stacked patch antenna structure 200. In such embodiment, the resonant cavity includes a volume defined by the conductive connectors 105 and the antenna pattern AP within which, in operation, a signal oscillates between the conductive connectors 105 and the antenna pattern AP, thereby forming the second antenna device AD2. In some embodiments, the resonant cavity includes a volume that corresponds to a resonance frequency of the second antenna device AD2.

Throughout the description, the conductive connectors 105, the second conductive pattern 110b, and the second conductive vias 120b are in combination referred to as a shielding structure 90. In such embodiment, the shielding structure 90 is electrically grounded through the redistribution structure 140 and the external connectors 150, and hence has the function of decreasing the interference between adjacent groups G1 and G2. Moreover, the conductive connectors 105 may provide structural support for the package structure 10. Although only one antenna pattern AP is surrounded as the group G1 or G2 by the conductive connectors 105 illustrated in FIG. 11B, the disclosure is not limited thereto. In other embodiments, one or more antenna pattern AP may be surrounded as the group G1 or G2 by the conductive connectors 105 according to the needs.

Referring back to FIG. 10, the third antenna device AD3 may include one of the antenna patterns AP, a corresponding stacked patch antenna structure 200, and a portion of the air cavity 250 therebetween. In some embodiments, the stacked patch antenna structure 200 has the lower patch antenna PA1 and the upper patch antenna PA2 directly over the antenna patterns AP. Specifically, the lower patch antenna PA1 and the upper patch antenna PA2 may be electrically floating, and overlapped with the antenna patterns AP. That is, as shown in FIG. 11B, the vertical projection of the antenna patterns AP may fall within the range of the vertical projection of the lower patch antenna PA1 and the upper patch antenna PA2. In operation, the third antenna device AD3 transmits and/or receives a signal by oscillating the signal between the antenna patterns AP and the lower patch antenna PAL. The upper patch antenna PA2 may be referred to as a radiating element that may increase the bandwidth and the gain of the third antenna device AD3.

In some embodiments, the first, second, and third antenna devices AD1, AD2, AD3 have different (operating) frequencies. For example, the first antenna device AD1 has a first frequency greater than a second frequency of the second antenna device AD2, and the third antenna device AD3 has a third frequency between the first and second frequencies. That is, when the package structure 10 is applied on the wireless communication application of 28 GHz, the first antenna device AD1 may be a high frequency (HF) device of 26.5 to 29.5 GHz, the second antenna device AD2 may be a low frequency (LF) device of 24.25 to 25.50 GHz, and the third antenna device AD3 may be a medium frequency (MF) device of 25 to 27 GHz.

Further, the ground plane GP may be formed in the redistribution layer 144a of the redistribution structure 140. The redistribution layer 144a is adjacent to the bottom surface 130b of the encapsulant 130, or closer to the bottom surface 130b of the encapsulant 130 than other redistribution layers of the redistribution structure 140. In the present embodiment, the ground plane GP is electrically grounded to provide the electrical shielding between the semiconductor die 160 and the first, second, and third antenna devices AD1, AD2, AD3. Therefore, the Electro-Magnetic Interference (EMI) between the semiconductor die 160 and the first, second, and third antenna devices AD1, AD2, AD3 may be reduced or isolated, thereby improving the performance of the package structure 10 with integrated antenna devices. In some embodiments, the redistribution layer 144a has a pattern density greater than a pattern density of other redistribution layers 144b, 144c, 144d, 144e (as shown in FIG. 4). That is, the redistribution layer 144a may be formed as a whole metal plate or block that provides the electrical shielding between the semiconductor die 160 and the first, second, and third antenna devices AD1, AD2, AD3. In such embodiment, the semiconductor die 160 at least has a vertical projection (completely) overlapped with the vertical projection of the redistribution layer 144a.

In some embodiments, the semiconductor die 160 may trap heat to become hot spots in the package structure 10. Therefore, the heat from the semiconductor die 160 may dissipate through a plurality of heat dissipation paths, such as the exposed backside of the semiconductor die 160, the external connectors 150, and the conductive connectors 105, thereby enhancing the reliability of the package structure 10.

Figure 12:
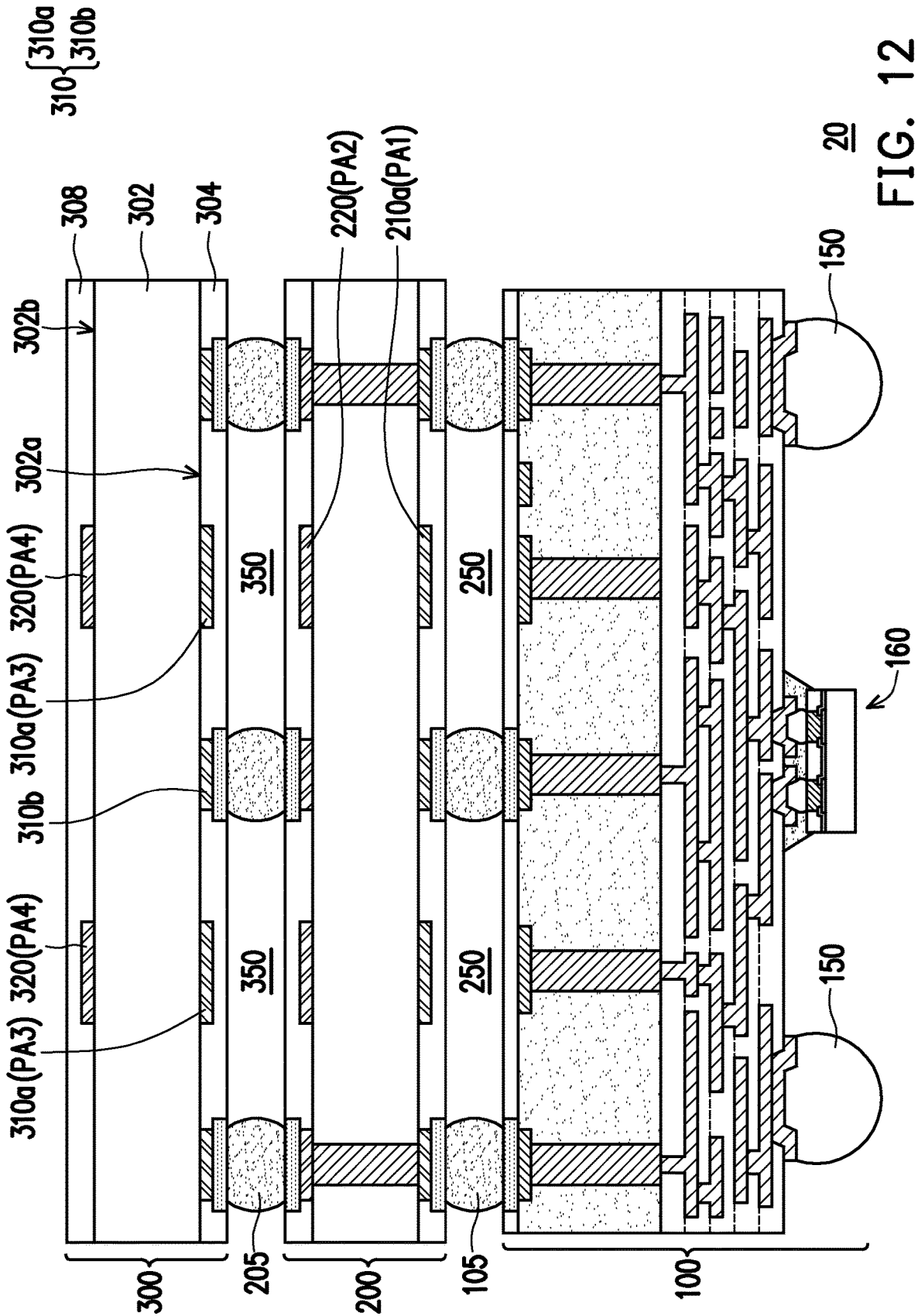
FIG. 12 is a cross-sectional view of a package structure in accordance with a second embodiment.

FIG. 12 is a cross-sectional view of a package structure in accordance with a second embodiment.

Referring to FIG. 12, a package structure 20 is similar to the package structure 10 of FIG. 10, that is, the configurations, materials, and functions of the package structure 20 are similar to those of the package structure 10, and thus the details are omitted herein. The main difference between the package structure 20 and the package structure 10 lies in that the package structure 20 further includes an additional stacked patch antenna structure 300 disposed on the stacked patch antenna structure 200. The additional stacked patch antenna structure 300 may be bonded onto the stacked patch antenna structure 200 by a plurality of conductive connectors 205, and separated from the stacked patch antenna structure 200 by an additional air cavity 350. In this case, the additional stacked patch antenna structure 300 may increasing the bandwidth and the gain of the package structure 20. In addition, the air cavity 350 filled with air with low permittivity (Dk=1) and low loss tangent (Df=0) properties may decrease the signal loss between the stacked patch antenna structures 200 and 300, thereby enhancing the performance of the package structure 20. In some embodiments, only one additional stacked patch antenna structure 300 is presented for illustrative purposes, however it should be noted that one or more additional stacked patch antenna structures may be provided to further increase the bandwidth and the gain of the package structure.

In detail, the additional stacked patch antenna structure 300 may at least include a substrate 302, a conductive layer 310, and a dielectric layer 304. The substrate 302 may have a first surface 302a and a second surface 302b opposite to each other. In some embodiments, the substrate 302 includes a dielectric material with low permittivity (Dk) and low loss tangent (Df) properties, thereby achieving a low loss in gain for the stacked patch antenna structure 300 in the antenna application. For example, a value of low Dk is less than 3, and a value of low Df is less than 0.001. In some embodiments, the substrate 302 may be made of a dielectric material, glass, organic materials, or the like. In some alternative embodiments, the substrate 302 may be made of a molding compound. The conductive layer 310 is formed on the first surface 302a of the substrate 302. In some embodiments, the conductive layer 310 includes a first conductive pattern 310a and a second conductive pattern 310b. The first conductive pattern 310a may include a plurality of lower patch antennas PA3 corresponding to the upper patch antennas PA2 of the stacked patch antenna structure 200. That is, the lower patch antennas PA3 may be arranged as arrays such as the N×N array or N×M arrays (N, M>0, N may or may not be equal to M), in some embodiments. The size of the array for the lower patch antennas PA3 may be designated and selected based on the demand, and is not limited to the disclosure. In certain embodiments, the lower patch antennas PA3 may include conductive blocks arranged in arrays, and in a top view, the shapes of the conductive blocks of the lower patch antennas PA3 may be round, elliptical, oval, square, rectangular, tetragonal, hexagonal, octagonal, or any suitable polygonal shape. The dielectric layer 304 may cover the surface of the conductive layer 310 (at least including the lower patch antennas PA3). In some embodiments, the dielectric layer 304 is similar to the dielectric layer 204, that is, the material, forming method and function of the dielectric layer 304 are similar to those of the dielectric layer 204, and thus the details are omitted herein.

In addition, a conductive layer 320 may be optionally formed on the second surface 302b of the substrate 302. In some embodiments, the conductive layer 320 is similar to the conductive layer 220, that is, the material, forming method and function of the conductive layer 320 are similar to those of the conductive layer 220, and thus the details are omitted herein. In some embodiments, the conductive layer 320 may include a plurality of upper patch antennas PA4 corresponding to the lower patch antennas PA3. That is, the upper patch antennas PA4 may be arranged as arrays such as the N×N array or N×M arrays (N, M>0, N may or may not be equal to M), in some embodiments. The size of the array for the upper patch antennas PA4 may be designated and selected based on the demand, and is not limited to the disclosure. In certain embodiments, the upper patch antennas PA4 may include conductive blocks arranged in arrays, and in a top view, the shapes of the conductive blocks of the upper patch antennas PA4 may be round, elliptical, oval, square, rectangular, tetragonal, hexagonal, octagonal, or any suitable polygonal shape.

Further, the additional stacked patch antenna structure 300 also includes a dielectric layer 308 covering the surface of the conductive layer 320. In some embodiments, the dielectric layer 308 is similar to the dielectric layer 204, that is, the material, forming method and function of the dielectric layer 308 are similar to those of the dielectric layer 204, and thus the details are omitted herein.

Figure 13:
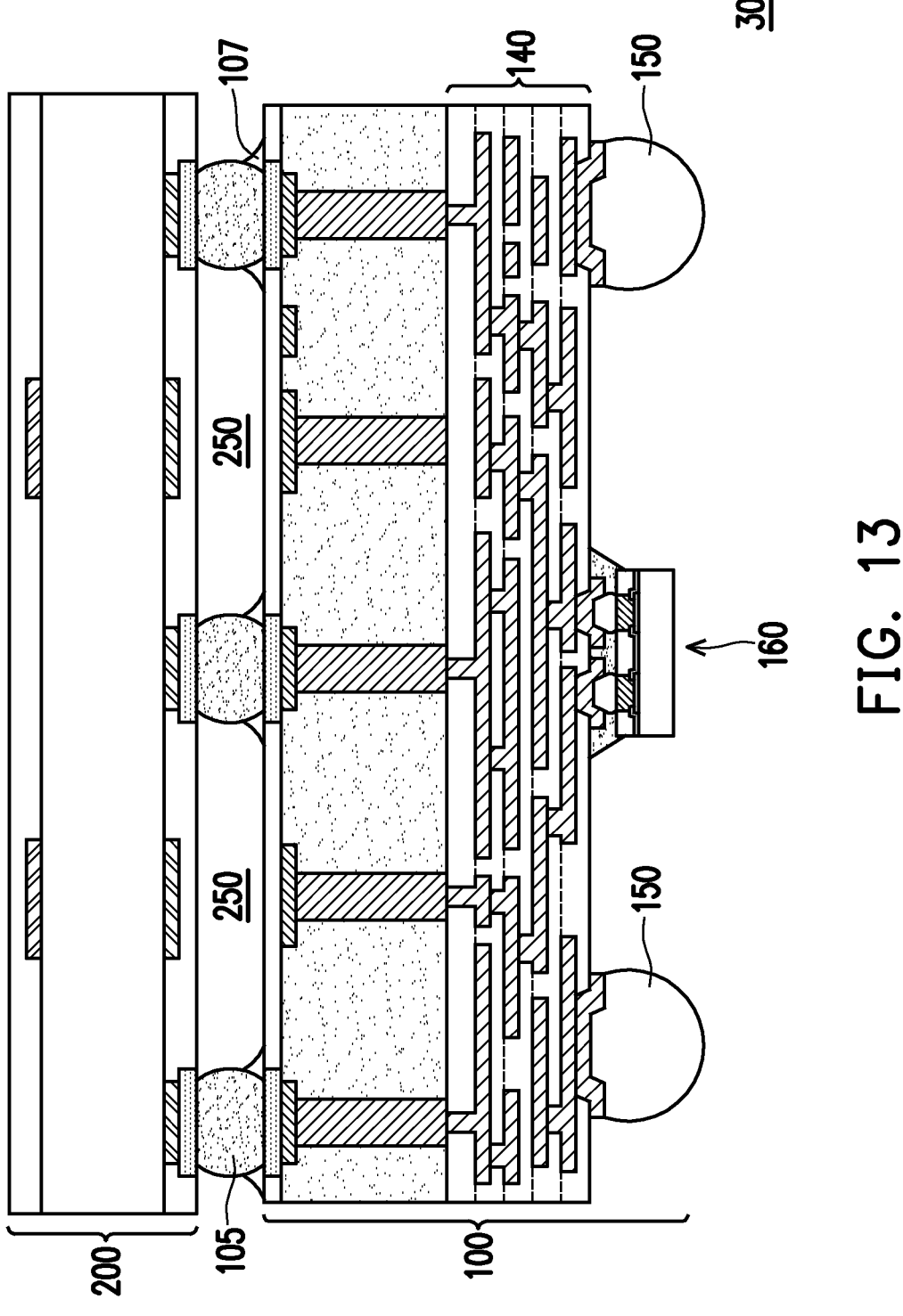
FIG. 13 is a cross-sectional view of a package structure in accordance with a third embodiment.

FIG. 13 is a cross-sectional view of a package structure in accordance with a third embodiment.

Referring to FIG. 13, a package structure 30 is similar to the package structure 10 of FIG. 10, that is, the configurations, materials, and functions of the package structure 30 are similar to those of the package structure 10, and thus the details are omitted herein. The main difference between the package structure 30 and the package structure 10 lies in that the package structure 30 further includes an epoxy flux 107 covering a portion of a sidewall of the conductive connectors 105. In some embodiments, before bonding the conductive connectors 105, the conductive connectors 105 are coated with a flux (not shown), such as a no-clean flux. In some alternative embodiments, the conductive connectors 105 may be dipped in the flux or the flux may be jetted onto the conductive connectors 105. In some other embodiments, the conductive connectors 105 may have an optional flux (not shown) formed thereon before they are reflowed. After the stacked patch antenna structure 200 is attached to the semiconductor package 100, at least some portions of the flux remain and form the epoxy flux 107 covering a portion of a sidewall of the conductive connectors 105, thereby providing structural support and protection to the conductive connectors 105. In some alternative embodiments, the epoxy flux 107 may also cover a portion of a sidewall of the conductive connectors 205 illustrated in FIG. 12.

Figure 14:
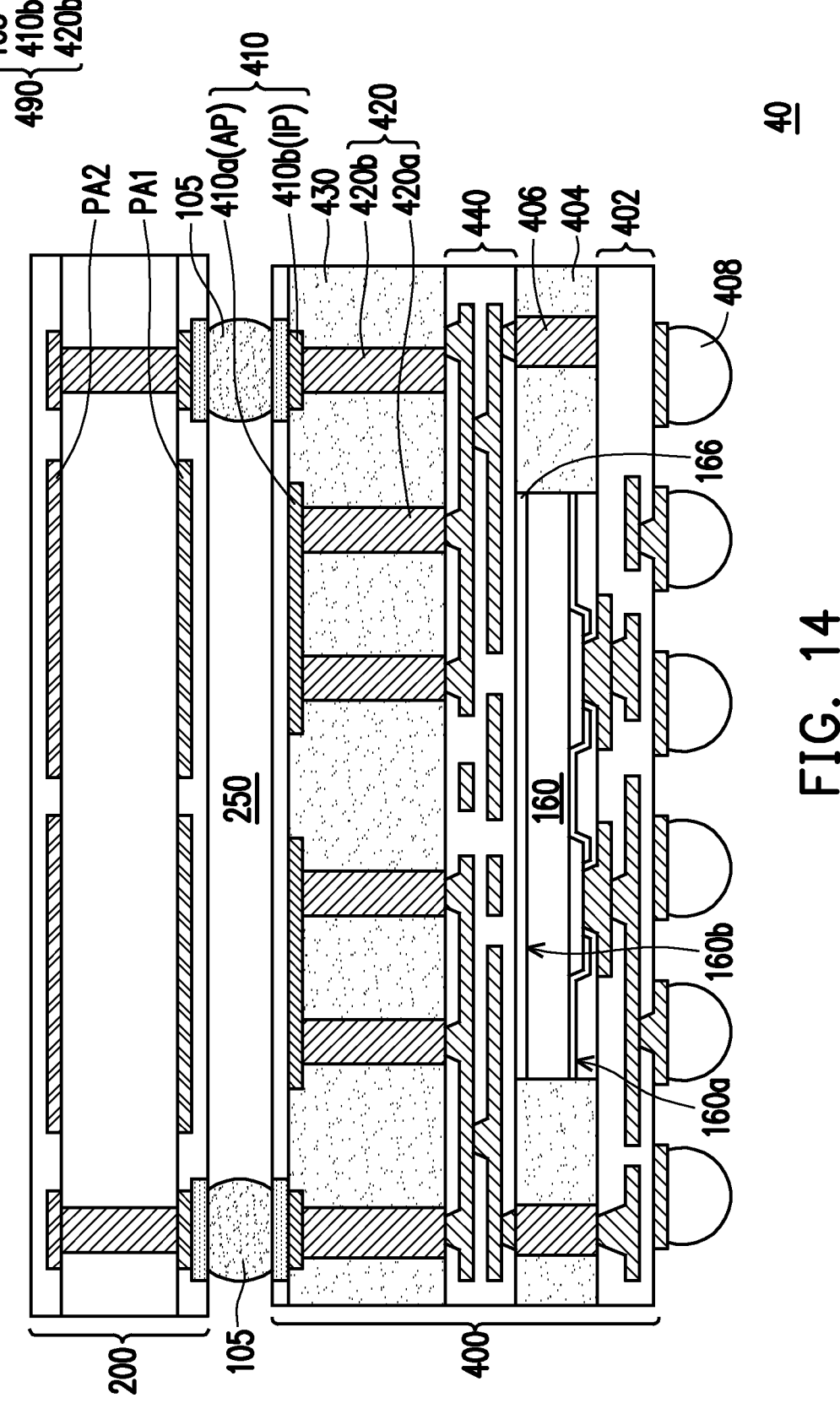
FIG. 14 is a cross-sectional view of a package structure in accordance with a fourth embodiment.

FIG. 14 is a cross-sectional view of a package structure in accordance with a fourth embodiment.

Referring to FIG. 14, a package structure 40 may include a semiconductor package 400, a stacked patch antenna structure 200, and a plurality of conductive connectors 105. The stacked patch antenna structure 200 is bonded onto the semiconductor package 400 by the conductive connectors 105, and the stacked patch antenna structure 200 is separated from the semiconductor package 400 by an air cavity 250. In the present embodiment, the air cavity 250 filled with air with low permittivity (Dk=1) and low loss tangent (Df=0) properties may decrease the signal loss between the semiconductor package 400 and the stacked patch antenna structure 200, thereby increasing the bandwidth and the gain of the package structure 40.

In detail, the semiconductor package 400 may include a semiconductor die 160, a front side redistribution structure 402, a first encapsulant 404, a plurality of through insulating vias (TIVs) 406, a backside redistribution structure 440, a second encapsulant 430, a plurality of conductive vias 420, and a conductive layer 410. The semiconductor die 160 may include an active surface or a front side 160a and a back surface or a backside 160b opposite to each other. The front side redistribution structure 402 may be disposed on the front side 160a of the semiconductor die 160. The backside redistribution structure 440 may be disposed on the backside 160b of the semiconductor die 160. Specifically, the semiconductor die 160 may be attached onto the backside redistribution structure 440 through an adhesive layer 166 such as die attach film (DAF). In some embodiments, each of the front side redistribution structure 402 and the backside redistribution structure 440 include a plurality of polymer layers (not labeled) and a plurality of redistribution layers (not labeled) stacked alternately. The number of the polymer layers or the redistribution layers is not limited by the disclosure. Since the configuration, material, forming method and function of the front side redistribution structure 402 and the backside redistribution structure 440 are similar to those of the redistribution structure 140, and thus the details are omitted herein.

In addition, as shown in FIG. 14, the semiconductor die 160 is sandwiched between the front side redistribution structure 402 and the backside redistribution structure 440, and laterally encapsulated by the first encapsulant 404. The semiconductor package 400 further includes the TIVs 406 surrounding the semiconductor die 160. In some embodiment, the TIVs 406 penetrate through the first encapsulant 404 to electrically connect the front side redistribution structure 402 and the backside redistribution structure 440.

Moreover, the second encapsulant 430 is disposed on the backside redistribution structure 440. The conductive layer 410 and the conductive vias 420 are embedded in the second encapsulant 430. Specifically, the conductive layer 410 may include a first conductive pattern 410a and a second conductive pattern 410b. The first conductive pattern 410a may include a plurality of antenna patterns AP. In some embodiments, the antenna patterns AP are arranged as arrays such as the N×N array or N×M arrays (N, M>0, N may or may not be equal to M). The size of the array for the antenna patterns AP may be designated and selected based on the demand, and is not limited to the disclosure. In certain embodiments, the antenna patterns AP may include conductive blocks arranged in arrays, and in a top view, the shapes of the conductive blocks of the antenna patterns AP may be round, elliptical, oval, square, rectangular, tetragonal, hexagonal, octagonal, or any suitable polygonal shape. The second conductive pattern 410b may include a plurality of isolation patterns IP. In some embodiments, the antenna patterns AP and the isolation patterns IP are physically separated or isolated from one another, and the antenna patterns AP are surrounded by the isolation patterns IP. Since the configuration, material, forming method and function of the conductive layer 410 are similar to those of the conductive layer 110, and thus the details are omitted herein.

In some embodiments, the conductive vias 420 includes a plurality of first conductive vias 420a and a plurality of second conductive vias 420b. The first conductive vias 420a are physically and electrically connected to the first conductive pattern 110a. In addition, the second conductive vias 420b are physically and electrically connected to the second conductive pattern 110b. Since the configuration, material, forming method and function of the conductive vias 420 are similar to those of the conductive vias 120, and thus the details are omitted herein.

In some embodiments, the stacked patch antenna structure 200 has the lower patch antenna PA1 and the upper patch antenna PA2 directly over the antenna patterns AP. Specifically, the lower patch antenna PA1 and the upper patch antenna PA2 may be electrically floating, and overlapped with the antenna patterns AP. A ground plane (not shown) may be formed in the backside redistribution structure 440. In operation, a signal oscillates between the ground plane and the antenna pattern AP, and the antenna pattern AP is coupled to the patch antennas PA1 and PA2 in the stacked patch antenna structure 200 the through electro-magnetic field, thereby increasing the bandwidth and the gain of the package structure 40. Further, the conductive connectors 105, the second conductive pattern 410*b*, and the second conductive vias 420*b* are in combination referred to as a shielding structure 490. In such embodiment, the shielding structure 490 is electrically grounded through the backside redistribution structure 440, and hence has the function of decreasing the interference between adjacent groups or units.

Moreover, the semiconductor package 400 may further include a plurality of external conductors 408. The external conductors 408 are formed on the lower surface of the front side redistribution structure 402. In some embodiments, the external conductors 408 may be used to bond the package structure 40 onto a circuit substrate (not shown), such as an organic flexible substrate, a printed circuit board, or the like.

Figure 15:
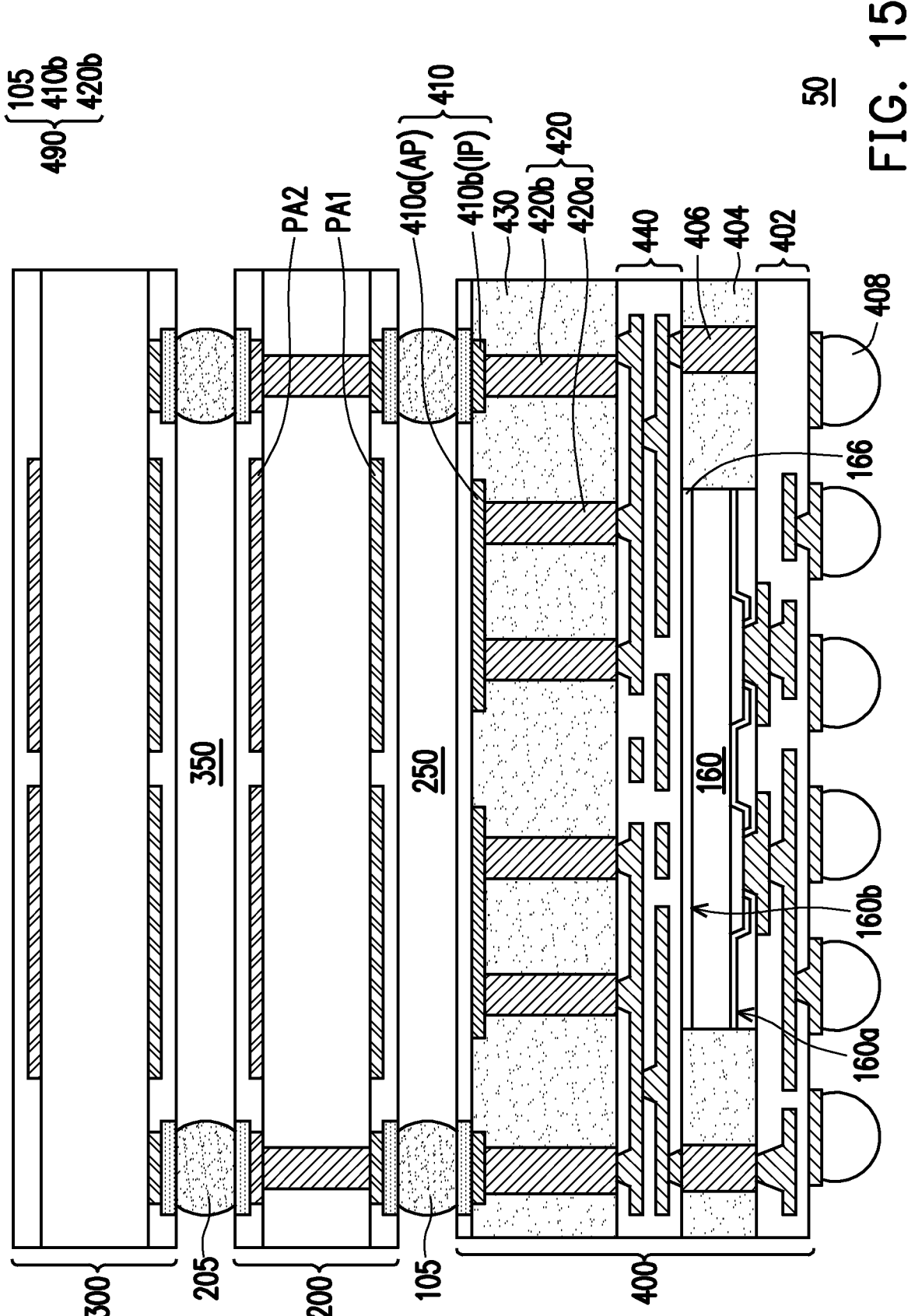
FIG. 15 is a cross-sectional view of a package structure in accordance with a fifth embodiment.

FIG. 15 is a cross-sectional view of a package structure in accordance with a fifth embodiment.

Referring to FIG. 15, a package structure 50 is similar to the package structure 40 of FIG. 14, that is, the configurations, materials, and functions of the package structure 50 are similar to those of the package structure 40, and thus the details are omitted herein. The main difference between the package structure 50 and the package structure 40 lies in that the package structure 50 further includes an additional stacked patch antenna structure 300 disposed on the stacked patch antenna structure 200. The additional stacked patch antenna structure 300 may be bonded onto the stacked patch antenna structure 200 by a plurality of conductive connectors 205, and separated from the stacked patch antenna structure 200 by an additional air cavity 350. In this case, the additional stacked patch antenna structure 300 may increasing the bandwidth and the gain of the package structure 50. In addition, the air cavity 350 filled with air with low permittivity (Dk=1) and low loss tangent (Df=0) properties may decrease the signal loss between the stacked patch antenna structures 200 and 300, thereby enhancing the performance of the package structure 50. In some embodiments, only one additional stacked patch antenna structure 300 is presented for illustrative purposes, however it should be noted that one or more additional stacked patch antenna structures may be provided to further increase the bandwidth and the gain of the package structure.

In accordance with an embodiment, a package structure includes a semiconductor package, a stacked patch antenna structure, and a plurality of conductive connectors. The semiconductor package includes a die. The stacked patch antenna structure is disposed on the semiconductor package, and separated from the semiconductor package by an air cavity. The plurality of conductive connectors is disposed in the air cavity between the semiconductor package and the stacked patch antenna structure to connect the semiconductor package and the stacked patch antenna structure.

In accordance with an embodiment, a package structure includes a semiconductor package, a first stacked patch antenna structure, and a plurality of conductive connectors. The semiconductor package includes an encapsulant and a die embedded in the encapsulant. The first stacked patch antenna structure is disposed on the semiconductor package, and separated from the semiconductor package by an air cavity. The conductive connectors are disposed in the air cavity between the semiconductor package and the first stacked patch antenna structure to connect the semiconductor package and the first stacked patch antenna structure.

In accordance with an embodiment, a method of forming a package structure includes: forming a conductive layer on a carrier; forming a plurality of first conductive vias and a plurality of second conductive vias on the conductive layer; forming an encapsulant to laterally encapsulate the plurality of first conductive vias and the plurality of second conductive vias; forming a redistribution structure on the encapsulant; mounting a die on the redistribution structure; debonding the carrier to form a semiconductor package; and bonding a stacked patch antenna structure onto the semiconductor package by a plurality of conductive connectors, wherein the stacked patch antenna structure is separated from the semiconductor package by an air cavity.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
a semiconductor package comprising:
patch antennas;
a redistribution structure;
a semiconductor die disposed on and electrically connected to the redistribution structure;
a first encapsulant laterally encapsulating the semiconductor die;
conductive vias disposed on and electrically connected to the redistribution structure, wherein the conductive vias and the semiconductor die are disposed on opposite sides of the redistribution structure respectively;
a second encapsulant disposed on the redistribution structure and laterally encapsulating the conductive vias, wherein the redistribution structure comprises a polymer layer and a topmost conductive layer adjacent to a bottom surface of the second encapsulant, and wherein the topmost conductive layer is spaced apart from the bottom surface of the second encapsulant by the polymer layer, the topmost conductive layer comprises ground planes corresponding the patch antennas, and the patch antennas have a vertical projection that falls within a range of a vertical projection of a corresponding ground plane among the ground planes;
a stacked patch antenna structure disposed on the second encapsulant of the semiconductor package; and
conductive connectors disposed between the semiconductor package and the stacked patch antenna structure to connect the semiconductor package and the stacked patch antenna structure, wherein portions of conductive vias are electrically connected to the conductive connectors.

2. The package structure of claim 1, wherein the second encapsulant comprises a base material and filler particles distributed in the base material.

3. The package structure of claim 1, wherein each of the patch antennas has a vertical projection that falls within the range of the vertical projection of the corresponding ground plane.

4. The package structure of claim 1, wherein one of the patch antennas, the corresponding ground plane among the ground planes, and a portion of the second encapsulant therebetween form a first antenna device.

5. The package structure of claim 4, wherein the conductive connectors respectively surround the patch antennas to form a resonant cavity between the semiconductor package and the stacked patch antenna structure, thereby forming a second antenna device.

6. The package structure of claim 1, wherein the topmost conductive layer has a vertical projection overlapped with a vertical projection of the semiconductor die.

7. The package structure of claim 1, wherein the stacked patch antenna structure comprises:
   a substrate comprising a dielectric material with low permittivity (Dk) and low loss tangent (Df) properties;
   lower patch antennas; and
   upper patch antennas, wherein the lower patch antennas and the upper patch antennas are disposed on opposite sides of the substrate, the lower patch antennas are disposed adjacent to the semiconductor package, and the upper patch antennas are disposed corresponding to the lower patch antennas, respectively.

8. The package structure of claim 7, wherein one of the lower patch antennas, a corresponding patch antenna, and a portion of an air cavity therebetween form a third antenna device.

9. The package structure of claim 7, wherein the upper patch antennas have a vertical projection that falls with a range of a vertical projection of a corresponding lower patch antenna.

10. The package structure of claim 1, wherein sidewalls of the first encapsulant substantially align with sidewalls of the second encapsulant.

11. The package structure of claim 1, wherein sidewalls of the first encapsulant substantially align with sidewalls of the redistribution structure.

12. A package structure, comprising:
   a semiconductor package comprising:
      a die laterally encapsulated by a first encapsulant;
      a first redistribution structure disposed on and electrically connected to the die;
      a second redistribution structure, wherein the first redistribution structure and the second redistribution structure are disposed on opposite sides of the die;
      conductive vias laterally encapsulated by a second encapsulant, wherein the conductive vias and the second encapsulant are disposed on the second redistribution structure, and the second encapsulant is spaced apart from the first encapsulant by the second redistribution structure;
   a first stacked patch antenna structure disposed on the semiconductor package, wherein the first stacked patch antenna structure comprises:
      a substrate comprising a dielectric material with low permittivity (Dk) and low loss tangent (Df) properties;
      lower patch antennas; and
      upper patch antennas, wherein the lower patch antennas and the upper patch antennas are disposed on oppo-site sides of the substrate, the lower patch antennas are disposed adjacent to the semiconductor package, and the upper patch antennas are disposed corre-sponding to the lower patch antennas respectively; and
   conductive connectors disposed between the semiconduc-tor package and the first stacked patch antenna structure to connect the semiconductor package and the first stacked patch antenna structure, wherein portions of the conductive vias are electrically connected to the con-ductive connectors and the second redistribution struc-ture.

13. The package structure of claim 12, wherein the second encapsulant comprises a base material and filler particles in the base material.

14. The package structure of claim 12, wherein the semiconductor package further comprises patch antennas, the second redistribution structure comprises a topmost conductive layer adjacent to a bottom surface of the second encapsulant, and the topmost conductive layer comprises ground planes corresponding the patch antennas.

15. The package structure of claim 14, wherein the topmost conductive layer has a pattern density greater than a pattern density of other conductive layers underlying the topmost conductive layer in the second redistribution struc-ture.

16. The package structure of claim 14, wherein the patch antennas have a vertical projection that falls within a range of a vertical projection of a corresponding ground plane.

17. The package structure of claim 12 further comprising a second stacked patch antenna structures disposed on the first stacked patch antenna structure.

18. A structure, comprising:
   a semiconductor package comprising:
      a redistribution structure comprising a polymer layer and a ground plane;
      a semiconductor die disposed on and electrically con-nected to the redistribution structure;
      a first encapsulant laterally encapsulating the semicon-ductor die;
      a second encapsulant disposed on the redistribution structure, wherein the semiconductor die is spaced apart from the second encapsulant by the redistribu-tion structure;
      a patch antenna embedded in the second encapsulant, wherein the ground planes are spaced apart from the second encapsulant by the polymer layer, and the patch antenna has a vertical projection that falls within a range of a vertical projection of the ground plane;
      conductive vias penetrating through the second encap-sulant and electrically connected to the redistribution structure; and
   a first stacked patch antenna structure disposed on and electrically connected to the conductive vias.

19. The structure of claim 18, wherein sidewalls of the first encapsulant substantially align with sidewalls of the second encapsulant.

20. The structure of claim 18, wherein sidewalls of the first encapsulant substantially align with sidewalls of the redistribution structure.

* * * * *